United States Patent
Yoshimatsu et al.

(10) Patent No.: US 12,341,078 B2
(45) Date of Patent: Jun. 24, 2025

(54) SEMICONDUCTOR DEVICE

(71) Applicant: Mitsubishi Electric Corporation, Tokyo (JP)

(72) Inventors: Naoki Yoshimatsu, Tokyo (JP); Shintaro Araki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 643 days.

(21) Appl. No.: 17/440,700

(22) PCT Filed: Aug. 9, 2019

(86) PCT No.: PCT/JP2019/031631
§ 371 (c)(1),
(2) Date: Sep. 17, 2021

(87) PCT Pub. No.: WO2021/028965
PCT Pub. Date: Feb. 18, 2021

(65) Prior Publication Data
US 2022/0173011 A1     Jun. 2, 2022

(51) Int. Cl.
*H01L 23/40*     (2006.01)
(52) U.S. Cl.
CPC ................................ *H01L 23/4006* (2013.01)
(58) Field of Classification Search
CPC ............... H01L 23/4006; H01L 23/552; H01L 23/498–49894; H01L 23/538–5389; H01L 23/3128; H01L 23/3114; H01L 23/28–3192; H01L 23/02–10; H01L 23/16–26; H01L 23/562–576;
(Continued)

(56) References Cited

U.S. PATENT DOCUMENTS

| 6,058,014 A | * | 5/2000 | Choudhury | H05K 3/325 |
| | | | | 439/71 |
| 9,468,087 B1 | * | 10/2016 | Joshi | H05K 1/0204 |
| 10,616,993 B1 | * | 4/2020 | Gawlowski | H05K 1/0203 |
| 2006/0067059 A1 | | 3/2006 | Ushijima et al. | |

(Continued)

FOREIGN PATENT DOCUMENTS

| CN | 109712949 A | | 5/2019 | |
| DE | 102017125052 A1 | * | 5/2019 | ............. H01L 23/32 |

(Continued)

OTHER PUBLICATIONS

"Notice of Reasons for Refusal" Office Action issued in JP 2021-539701; mailed by the Japanese Patent Office on Jun. 28, 2022.
International Search Report; Written Opinion; and Notification of Transmittal of the International Search Report and the Written Opinion of the International Searching Authority, or the Declaration issued in PCT/JP2019/031631; mailed Sep. 10, 2019.

(Continued)

*Primary Examiner* — Cuong B Nguyen
(74) *Attorney, Agent, or Firm* — Studebaker Brackett PLLC

(57) ABSTRACT

A semiconductor device according to the present invention includes a cooler, a semiconductor package provided on an upper surface of the cooler, a metal plate having a main section provided on an upper surface of the semiconductor package, a spring that is provided above the main section and presses the main section toward the upper surface of the semiconductor package with an elastic force and a fixture that fixes the spring to an upper surface of the main section with the spring exerting the elastic force, wherein a surface, which faces the upper surface of the semiconductor package, of the main section is flat.

17 Claims, 6 Drawing Sheets

(58) Field of Classification Search
CPC ..... H01L 23/60–62; H01L 23/36–3738; H01L 23/40–4093; H01L 23/42–4338; H01L 24/29; H01L 24/33; H01L 24/40; H01L 24/45; H01L 24/48; H01L 24/73; H01L 24/83; H01L 24/84; H01L 23/4334; H01L 23/3142; H01L 23/3157; H01L 2023/4031; H01L 2023/405; H01L 2023/4081; H01L 2224/291; H01L 2224/29101; H01L 2224/32245; H01L 2224/33181; H01L 2224/40137; H01L 2224/45124; H01L 2224/48247; H01L 2224/73221; H01L 2224/73265; H01L 2224/83801; H01L 2224/84801; H01L 2224/16155–16168; H01L 2224/16225–1624; H01L 2224/32155–32168; H01L 2224/32225–3224; H01L 2224/73204; H01L 2224/32221–3226; H01L 2924/10272; H01L 2924/1033; H01L 2924/13055; H01L 2924/1815; H01L 2924/181–186; H01L 2924/15–17798; H01L 21/4846–4867; H01L 21/4807–481; H01L 21/56–568; H01L 25/00–50; H01L 25/165; H01L 21/52–54; H01L 21/4817; H01L 21/4803–481; H01L 21/4871–4882; H01L 2225/00–1094; H01L 2924/3025

See application file for complete search history.

(56) References Cited

U.S. PATENT DOCUMENTS

| | | | |
|---|---|---|---|
| 2007/0000544 A1* | 1/2007 | Thompson | F04B 53/1025 137/516.23 |
| 2013/0083504 A1* | 4/2013 | Fukuzono | H01L 23/4006 361/783 |
| 2014/0003111 A1 | 1/2014 | Ichijo et al. | |
| 2014/0299982 A1* | 10/2014 | Minamio | H01L 25/162 257/786 |
| 2015/0194367 A1* | 7/2015 | Grosskreuz | F16B 31/028 438/5 |
| 2018/0158804 A1* | 6/2018 | Martin | H01L 25/072 |

FOREIGN PATENT DOCUMENTS

| | | | |
|---|---|---|---|
| JP | 2006-100327 A | | 4/2006 |
| JP | 2012-080027 A | | 4/2012 |
| JP | 2013118423 A | * | 6/2013 |
| JP | 2014-011915 A | | 1/2014 |
| JP | 2014-33119 A | | 2/2014 |
| JP | 2014033119 A | * | 2/2014 |
| JP | 5754528 B2 | | 7/2015 |

OTHER PUBLICATIONS

An Office Action mailed by the Chinese Patent Office on Apr. 26, 2024, which corresponds to Chinese Patent Application No. 201980099008.9 and is related to U.S. Appl. No. 17/440,700.

* cited by examiner

SEMICONDUCTOR DEVICE

FIELD

The present invention relates to a semiconductor device.

BACKGROUND

PTL 1 discloses a semiconductor module having a first through hole formed in its central portion. A spring is arranged on the upper surface side of the semiconductor module. A cooling device having a screw hole is arranged on the lower surface side of the semiconductor module. A screw having a head portion is threaded into the screw hole of the cooling device via the first through hole of the semiconductor module, to fix the semiconductor module to the cooling device. The head portion of the screw remains spaced a predetermined distance apart from the upper surface of the semiconductor module, and the spring is sandwiched between the head portion of the screw and the upper surface of the semiconductor module.

CITATION LIST

Patent Literature

[PTL 1] JP 5754528 B

SUMMARY

Technical Problem

In a semiconductor device, a gap may occur between stacked components at the time of high temperature or low temperature depending on an expansion-contraction difference between the components. Alternatively, an overpressurized state may occur between the components. When the occurrence of the gap and the overpressurized state are repeated, grease applied between the components may be pumped out.

In PTL 1, a resin surface of a package resin-molded is pressed by the spring. As a result, a cooling surface of the package is pressed against a cooler. Accordingly, a stable pressing force can be obtained to correspond to a change in ambient temperature, and grease applied between the cooling surface of the package and the cooler can be prevented from being pumped out.

However, the resin surface is pressed by the spring in direct contact with each other, a creep or a crack of resin may occur in a portion having a high stress.

The present invention has been made to solve the above-described problem, and is directed to obtaining a semiconductor device the reliability of which can be improved.

Solution to Problem

A semiconductor device according to the present invention includes a cooler, a semiconductor package provided on an upper surface of the cooler, a metal plate having a main section provided on an upper surface of the semiconductor package, a spring that is provided above the main section and presses the main section toward the upper surface of the semiconductor package with an elastic force and a fixture that fixes the spring to an upper surface of the main section with the spring exerting the elastic force, wherein a surface, which faces the upper surface of the semiconductor package, of the main section is flat.

Advantageous Effects of Invention

In a semiconductor device according to the present invention, a semiconductor package is pressed by a flat surface of a metal plate with an elastic force of a spring. Accordingly, a stress can be more prevented from being locally applied to the semiconductor package, as compared with when the semiconductor package is directly pressed by the spring. Therefore, a creep or a crack can be prevented from occurring in the semiconductor package so that the reliability can be improved.

DESCRIPTION OF EMBODIMENTS

Figure 1:
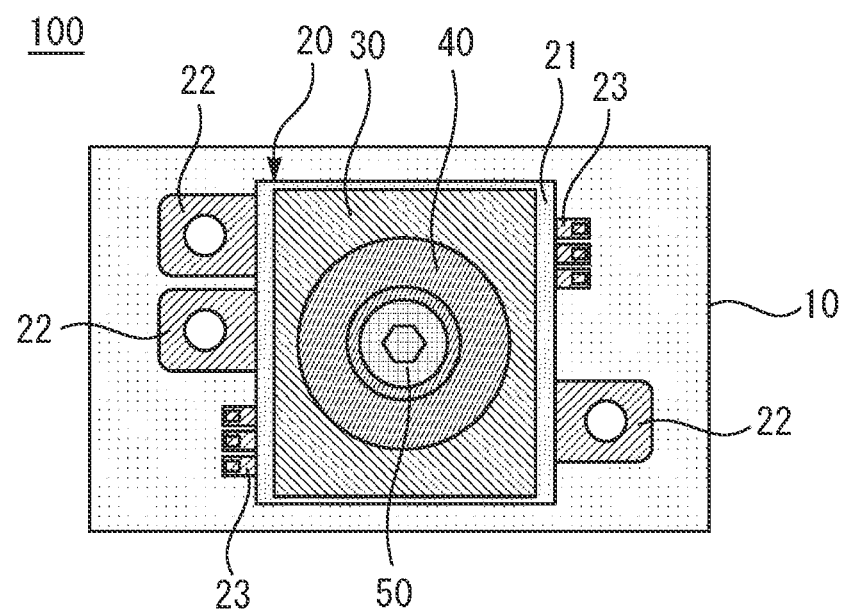
FIG. 1 is a plan view of a semiconductor device according to the first embodiment.

A semiconductor device according to an embodiment of the present invention are described with reference to drawings. Identical or corresponding constitutional elements are given the same reference numerals, and the repeated description of such constitutional elements may be omitted.

First Embodiment

Figure 2:
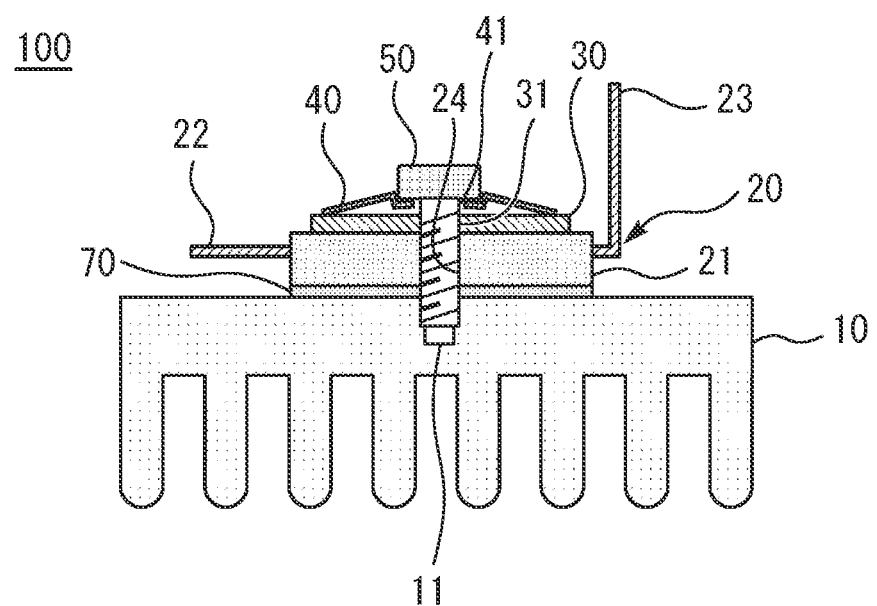
FIG. 2 is a cross-sectional view of the semiconductor device according to the first embodiment.

FIG. 1 is a plan view of a semiconductor device 100 according to the first embodiment. FIG. 2 is a cross-sectional view of the semiconductor device 100 according to the first embodiment. The semiconductor device 100 includes a cooler 10. The cooler 10 is also referred to as a heat sink. The cooler 10 is formed of metal, for example.

A semiconductor module 20 is provided on an upper surface of the cooler 10. The semiconductor module 20 is a power module, for example. The semiconductor module 20 may be a three-phase inverter circuit, for example. The semiconductor device 100 is used for an inverter that controls a motor of an electric vehicle or an electric train, for example. The semiconductor device 100 may be used for a regenerative converter.

The semiconductor module 20 includes a semiconductor package 21 provided on the upper surface of the cooler 10. The semiconductor package 21 is formed of resin. The semiconductor module 20 is molded from resin.

Grease 70 is provided between the cooler 10 and the semiconductor package 21. The grease 70 is applied to fill a fine gap between a rear surface of the semiconductor package 21 and the cooler 10. The rear surface of the semiconductor package 21 is a cooling surface.

A main terminal 22 and a signal terminal 23 extend from the semiconductor package 21. The main terminal 22 is a power supply terminal of the semiconductor module 20. The main terminal 22 extends in a horizontal direction from a side surface of the semiconductor package 21. The horizontal direction is a direction along the upper surface of the cooler 10. The signal terminal 23 is a terminal that inputs a signal for turning on and off a semiconductor chip included in the semiconductor package 21. The signal terminal 23 extends in the horizontal direction from a side surface of the semiconductor package 21, and is bent upward.

A metal plate 30 is provided on the semiconductor package 21. The entire metal plate 30 in the present embodiment is provided directly above the semiconductor package 21. The metal plate 30 is not limited to this, but may have a portion provided on at least an upper surface of the semiconductor package 21. The metal plate 30 in the present embodiment has a flat plate shape. The metal plate 30 is not limited to this, but a surface, which faces the upper surface of the semiconductor package 21, of the metal plate 30 may be flat.

The upper surface of the semiconductor package 21 is a resin surface, and is planar. The upper surface of the semiconductor package 21 and the flat surface of the metal plate 30 contact each other.

A spring 40 is provided above the metal plate 30. The spring 40 is a belleville spring, for example. The spring 40 is pressed from above by a fixture 50, described below, to generate an elastic force in a direction perpendicular to an upper surface of the metal plate 30. Accordingly, the spring 40 presses the metal plate 30 toward the upper surface of the semiconductor package 21 with the elastic force. The spring 40 is provided in a central portion of the semiconductor package 21.

The semiconductor device 100 includes the fixture 50. The fixture 50 is a screw, for example. A recess 11 is formed on the upper surface of the cooler 10. The semiconductor package 21 has a through hole 24 formed to penetrate therethrough from the upper surface to the rear surface. The metal plate 30 has a through hole 31 formed to penetrate therethrough from the upper surface to its rear surface. Further, the spring 40 has a through hole 41 formed to penetrate therethrough from its upper surface to its rear surface. The recess 11 and the through holes 24, 31, and 41 overlap one another in a planar view.

The recess 11 and the through holes 24, 31, and 41 are each a screw hole. A head portion of the fixture 50 is provided on the spring 40. The fixture 50 is inserted into the recess 11 from above the spring 40 via the through holes 41, 31, and 24. The fixture 50 penetrates the spring 40, the metal plate 30, and the semiconductor package 21 to reach the cooler 10. As a result, the semiconductor module 20 can be fastened and fixed to the cooler 10.

The fixture 50 fixes the spring 40 to the upper surface of the metal plate 30 with the spring 40 exerting the elastic force. When the spring 40 is tightened by the fixture 50, a peripheral portion of the spring 40 presses the metal plate 30. As a result, the metal plate 30 presses the upper surface of the semiconductor package 21.

The fixture 50 is formed of metal. The fixture 50 electrically connects the metal plate 30 and the cooler 10 to each other.

Figure 3:
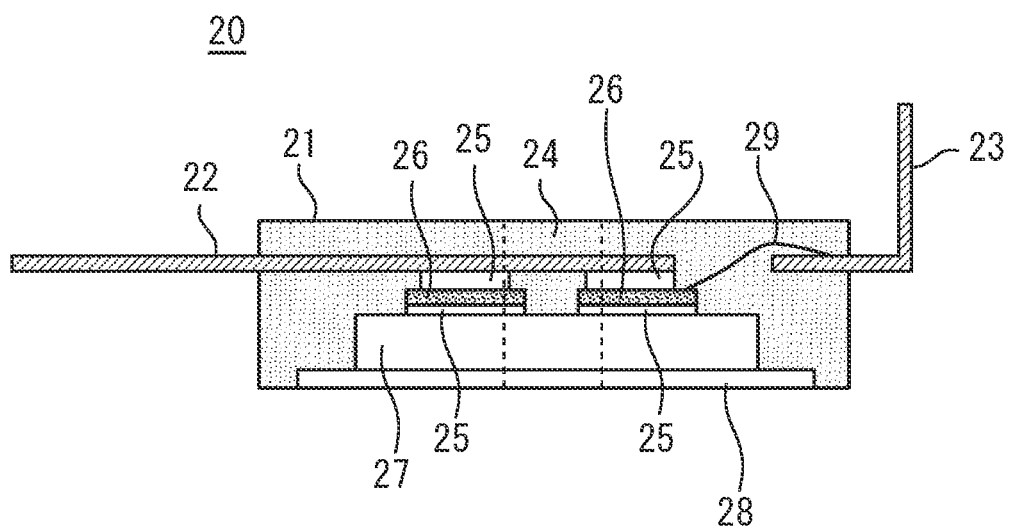
FIG. 3 is a cross-sectional view of the semiconductor module according to the first embodiment.

FIG. 3 is a cross-sectional view of the semiconductor module 20 according to the first embodiment. The semiconductor module 20 includes a heat spreader 27, a plurality of semiconductor chips 26 provided on the heat spreader 27, and an insulating sheet 28 provided under the heat spreader 27. The insulating sheet 28 is provided to electrically insulate the cooler 10 and the heat spreader 27 from each other. The plurality of semiconductor chips 26, the heat spreader 27, and the insulating sheet 28 are covered with resin. The through hole 24 is formed in a resin portion of the semiconductor package 21.

An upper surface of each of the semiconductor chips 26 is bonded to the main terminal 22 with solder 25. One of the plurality of semiconductor chips 26 is connected to the signal terminal 23 with a wire 29. The wire 29 is an aluminum wire, for example. A lower surface of the semiconductor chip 26 is bonded to the heat spreader 27 with solder 25. Accordingly, the heat spreader 27 is an electrode on the lower surface of the semiconductor chip 26. The heat spreader 27 is bonded to a main terminal 22 other than the main terminal 22 illustrated in FIG. 3 with solder. The semiconductor chip 26 and the main terminal 22 may be connected to each other with a wire.

The semiconductor chip 26 connected to the signal terminal 23 with the wire 29 is a switching device, for example. The switching device is an insulated gate bipolar transistor (IGBT), for example. If the semiconductor chip 26 is an IGBT, the semiconductor chip 26 has its emitter and collector electrically connected to the main terminals 22, and has its gate electrically connected to the signal terminal 23. The other semiconductor chip 26 is a free wheeling diode (FWD), for example.

In the present embodiment, the semiconductor module 20 includes the plurality of semiconductor chips 26. The semiconductor module 20 is not limited to this, but may include one or more semiconductor chips 26.

Then, an operation of the semiconductor device 100 will be described. When a signal is inputted from the signal terminal 23, the semiconductor chip 26 is turned on. As a result, a current flows through the main terminal 22. When a weak current or voltage of the signal terminal 23 is controlled, on-off of a current flowing through a main circuit to which the main terminal 22 is to be connected is controlled. The main circuit is a circuit to be formed by the plurality of semiconductor chips 26.

Generally when the semiconductor chip 26 is energized, a DC loss occurs. Generally when the semiconductor chip 26 is turned on or off, a switching loss occurs. The semiconductor chip 26 generates heat due to the losses.

The cooler 10 has a function of causing the semiconductor module 20 to dissipate heat. In the present embodiment, a cooling surface of the semiconductor package 21 and the cooler 10 are made to adhere to each other. As a result, heat can be efficiently transmitted from the semiconductor module 20 to the cooler 10.

Further, the grease 70 is applied between the cooling surface of the semiconductor package 21 and the cooler 10. The grease 70 is heat-dissipating grease having high thermal conductivity containing filler, for example. The grease 70 fills a small gap between the semiconductor package 21 and the cooler 10 so that heat dissipation can be improved.

In the semiconductor device 100, a plurality of members are stacked. Each of the members repeatedly expands and contracts according to a linear expansion coefficient depending on a temperature change. The temperature change occurs depending on heat generation of the semiconductor chip 26 or a change in ambient temperature, for example. On the other hand, in the present embodiment, the semiconductor package 21 is pressed against the cooler 10 with the elastic force of the spring 40. Accordingly, the expansion and contraction of each of the members constituting the semiconductor device 100 can be absorbed by a stroke of the spring 40. As a result, the semiconductor package 21 can be stably pressed from above, and the grease 70 can be prevented from being pumped out due to the temperature change.

When the belleville spring is used as the spring 40, a high load can be obtained while the thickness of the spring 40 is suppressed. A plate spring may be used as the spring 40. When the plate spring is used, the degree of freedom of a shape of the spring 40 can be improved.

If the resin surface is directly pressed by the spring, a large stress is locally applied to the semiconductor package so that a creep or a crack may occur. Particularly when the semiconductor chip operates to increase in temperature, sealing resin may be softened. As a result, a portion, which contacts the spring and the large stress is to be applied thereto, in the resin surface may easily been depressed. At this time, a load to the semiconductor package from the spring may decrease. When the load decreases, the grease provided on the rear surface of the semiconductor package drains off so that heat dissipation may deteriorate.

On the other hand, in the present embodiment, the spring 40 does not contact the resin surface. The flat surface of the metal plate 30 presses the semiconductor package 21. Accordingly, partial contact by the spring 40 can be prevented. Therefore, a stress can be more prevented from being locally applied to the semiconductor package 21, as compared with when the semiconductor package 21 is directly pressed by the spring 40. That is, a load can be equalized on the upper surface of the semiconductor package 21.

In the present embodiment, the semiconductor package 21 can be thus uniformly pressed while a high load is applied to the semiconductor package 21. Therefore, a creep or a crack can be prevented from occurring in the semiconductor package 21. As a result, a stable pressing force can be ensured, and the grease 70 can be prevented from being pumped out. Accordingly, a temperature rise of the semiconductor chip 26 and thermal destruction of the semiconductor module 20 can be suppressed. Therefore, the long-term reliability can be ensured.

When a circular belleville spring is used as the spring 40, the metal plate 30 can be isotropically pressed against the center of the spring 40. Therefore, the semiconductor package 21 can be further pressed in a well-balanced manner. The spring 40 preferably has a large diameter in a range in which it falls within the upper surface of the metal plate 30 to be able to press a wide range. The diameter of the belleville spring may be larger than the half of the width of the upper surface of the semiconductor package 21, for example.

Generally, the semiconductor chip 26 turns on and off a large current at a high frequency. Accordingly, the semiconductor chip 26 easily generates electromagnetic noise. In the present embodiment, electromagnetic noise generated by the semiconductor chip 26 can be shielded by the metal plate 30. Particularly, the metal plate 30 and the cooler 10 are electrically connected to each other with the fixture 50. Accordingly, the metal plate 30 is at the same potential as that of the cooler 10 as a frame ground. Therefore, a high shielding effect can be obtained. As a result, a control substrate arranged around the semiconductor module 20 can be prevented from erroneously operating.

If an electromagnetic noise shielding effect is not required, the metal plate 30 and the cooler 10 need not be electrically connected to each other.

The fixture 50 may be a component other than a screw. The fixture 50 may be able to fix the spring 40 to the upper surface of the metal plate 30 with the spring 40 exerting the elastic force.

To equalize a load on the upper surface of the semiconductor package 21, the area of the metal plate 30 is preferably larger if it falls within a range in which an insulation distance between the metal plate 30 and the main terminal 22 or the signal terminal 23 can be maintained. To improve the electromagnetic noise shielding effect, the area of the metal plate 30 is also preferably larger. The metal plate 30 may cover 90% or more, for example, of the upper surface of the semiconductor package 21. The metal plate 30 may cover the entire upper surface of the semiconductor package 21.

The semiconductor chip 26 may be made with a wide bandgap semiconductor. The wide bandgap semiconductor is silicon carbide, a gallium nitride-based material, or diamond. In the present embodiment, even when the semiconductor chip 26 made with a wide bandgap semiconductor having a high heat resistance is operated at high temperature, a creep of resin can be suppressed.

These modifications can be applied, as appropriate, to a semiconductor device according to the following embodiments. Note that the semiconductor devices according to the following embodiments are similar to those of the first embodiment in many respects, and thus differences between the semiconductor devices according to the following embodiments and those of the first embodiment will be mainly described below.

Second Embodiment

Figure 4:
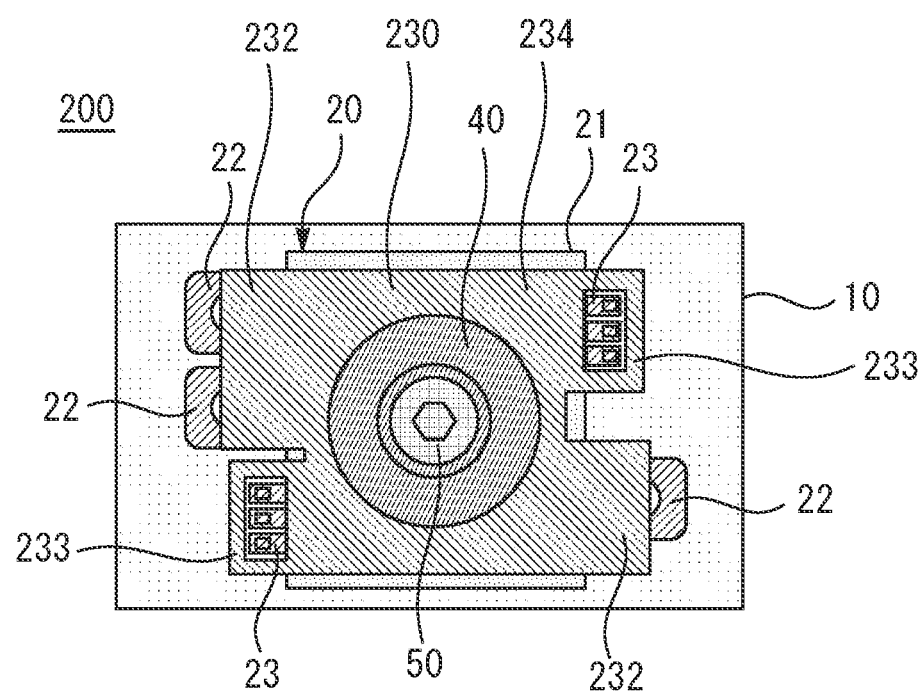
FIG. 4 is a plan view of a semiconductor device according to the second embodiment.

FIG. 4 is a plan view of a semiconductor device 200 according to the second embodiment. In the semiconductor device 200, a structure of a metal plate 230 differs from that in the first embodiment. The metal plate 230 has a flat plate shape. The metal plate 230 includes a main section 234 provided on an upper surface of a semiconductor package 21. The main section 234 corresponds to the metal plate 30 in the first embodiment, and is pressed by a spring 40.

A first section 232 and a second section 233 extend toward the outside of the semiconductor package 21 in a planar view from the main section 234. The first section 232 and the second section 233 extend in a horizontal direction. A direction in which the first section 232 and the second section 233 extend may be inclined with respect to the horizontal direction.

The first section 232 overlaps a main terminal 22 in a planar view. As a result, electromagnetic noise caused by on-off of energization of the main terminal 22 can be shielded. Particularly when a control substrate is provided above the metal plate 230, a terminal such as the main terminal 22 extending from the semiconductor package 21 and the control substrate can be separated from each other by the metal plate 230. As a result, the control substrate can be prevented from being affected by electromagnetic noise from the main terminal 22 or the like.

An end portion, on the opposite side to the semiconductor package 21, of the main terminal 22 protrudes from the metal plate 230 in a planar view. As a result, a wiring to the main terminal 22 can be prevented from being prohibited by the metal plate 230. The main terminal 22 is not limited to this, but the entire metal terminal 22 may be covered with the metal plate 230 in a planar view.

The second section 233 surrounds a signal terminal 23. An opening is formed in the second section 233. The signal terminal 23 extends upward via the opening of the second section 233. As a result, electromagnetic noise from a semiconductor chip 26, the main terminal 22, or the like can be shielded. Therefore, the signal terminal 23 can be prevented from being affected by electromagnetic noise.

Third Embodiment

Figure 5:
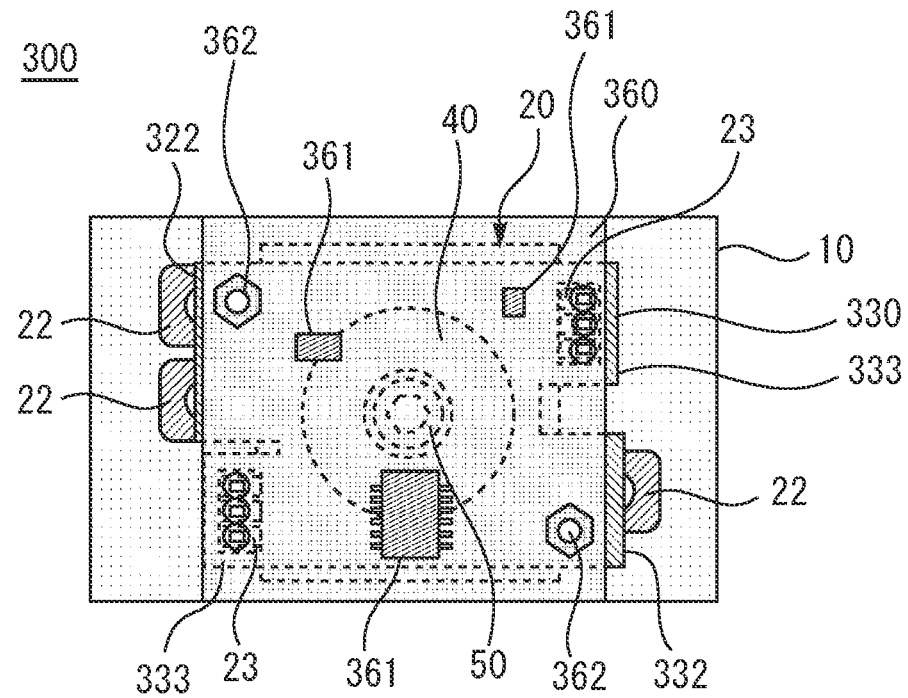
FIG. 5 is a plan view of a semiconductor device according to the third embodiment.
Figure 6:
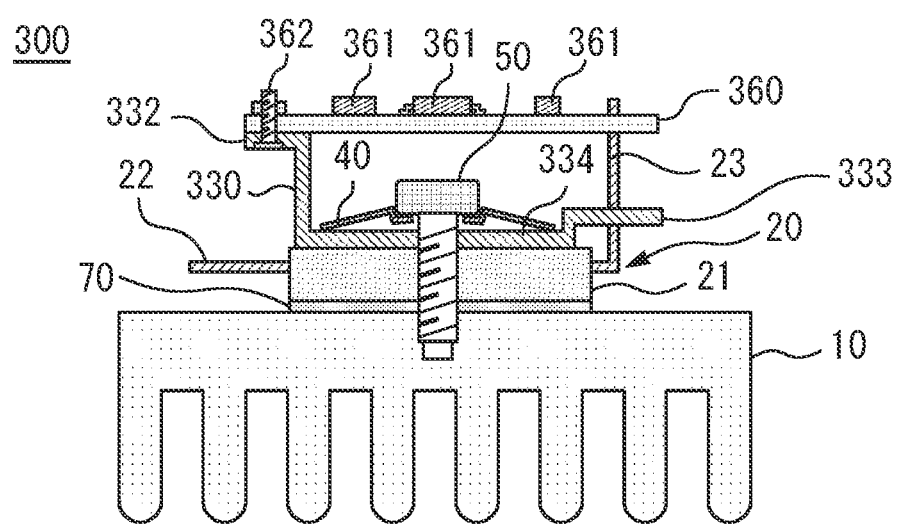
FIG. 6 is a cross-sectional view of the semiconductor device according to the third embodiment.

FIG. 5 is a plan view of a semiconductor device 300 according to the third embodiment. FIG. 6 is a cross-sectional view of the semiconductor device 300 according to the third embodiment. In the semiconductor device 300, a structure of a metal plate 330 differs from that in the first embodiment. The metal plate 330 includes a main section 334 provided on an upper surface of a semiconductor package 21. The main section 334 has a flat plate shape, and corresponds to the metal plate 30 in the first embodiment.

A first section 332 and a second section 333 extend toward the outside of the semiconductor package 21 in a planar view from the main section 334. The metal plate 330 is bent upward outside the main section 334. As a result, the first section 332 and the second section 333 are formed. Respective upper end portions of the first section 332 and the second section 333 are bent outward. The respective upper end portions of the first section 332 and the second section 333 extend in a horizontal direction.

The first section 332 overlaps a main terminal 22 in a planar view. As a result, electromagnetic noise from the main terminal 22 can be shielded, like in the second embodiment. The second section 333 surrounds a signal terminal 23. As a result, the signal terminal 23 can be prevented from being affected by electromagnetic noise from a semiconductor chip 26, the main terminal 22, or the like, like in the second embodiment.

When the metal plate 330 is bent upward, a distance between a terminal extending from the semiconductor package 21 and the metal plate 330 can be ensured. Particularly, a creepage distance between the metal plate 330 and each of the main terminal 22 and the signal terminal 23 can be ensured. Therefore, a creepage discharge between the metal plate 330 and the main terminal 22 or the signal terminal 23 can be suppressed. When the metal plate 330 is bent inside an end portion of the semiconductor package 21, the creepage distance between the metal plate 330 and each of the main terminal 22 and the signal terminal 23 can be kept large.

The semiconductor device 300 includes a control substrate 360 provided above the metal plate 330. The first section 332 extends upward from the main section 334, and supports the control substrate 360. The first section 332 is a support section that supports the control substrate 360. The control substrate 360 is loaded on a portion of the first section 332, extending in the horizontal direction in the upper end portion of the first section 332.

A stud bolt 362 is embedded in the first section 332. The control substrate 360 is fixed to the metal plate 330 with the stud bolt 362. The stud bolt 362 enables positioning to be performed when the control substrate 360 is attached. The control substrate 360 may be fixed to the metal plate 330 with a bolt other than the stud bolt 362. A method of fixing the control substrate 360 is not limited.

An electronic component 361 such as an IC is mounted on an upper surface of the control substrate 360. The signal terminal 23 extends upward, and is electrically connected to the control substrate 360. The control substrate 360 controls on-off of the semiconductor chip 26 via the signal terminal 23, for example.

In the present embodiment, the metal plate 330 can be used as a member for supporting the control substrate 360. Therefore, the number of parts for loading the control substrate 360 can be reduced. The semiconductor package 21 and the main terminal 22 are separated from the control substrate 360 by the metal plate 330. Accordingly, the control substrate 360 can be prevented from being affected by electromagnetic noise.

In a configuration in which a portion, which extends upward from the main section 334, in the metal plate 330, for example, is pressed to press the semiconductor package 21, a force that floats at a central portion of the main section 334 using a folded portion of the metal plate 330 as a support may be exerted. At this time, a large stress is applied to a portion, which contacts the folded portion of the metal plate 330, in the semiconductor package 21 so that a creep or the like may occur.

On the other hand, in the present embodiment, a spring 40 is fixed to an upper surface of the main section 334 with the spring 40 exerting an elastic force. The spring 40 is provided on the main section 334, to press the main section 334 toward the upper surface of the semiconductor package 21 with the elastic force. When the spring 40 thus presses only the main section 334 having a flat plate shape in the metal plate 330, a stress to be applied to the semiconductor package 21 can be equalized. Therefore, a creep or a crack can be prevented from occurring in the semiconductor package 21. If a surface, which faces the upper surface of the semiconductor package 21, of the main section 334 is flat, an effect of the present embodiment can be obtained.

Fourth Embodiment

Figure 7:
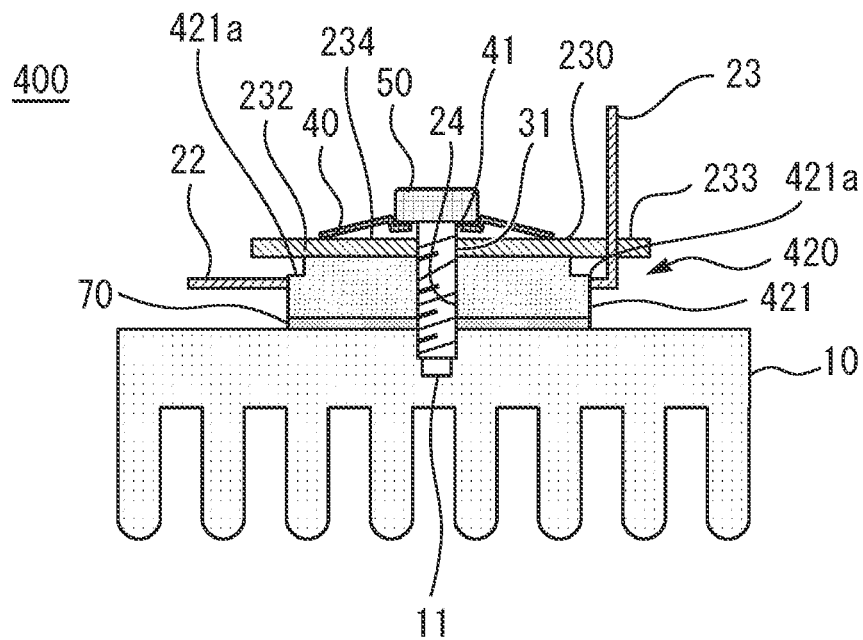
FIG. 7 is a cross-sectional view of a semiconductor device according to the fourth embodiment.

FIG. 7 is a cross-sectional view of a semiconductor device 400 according to the fourth embodiment. In the semiconductor device 400, a structure of a semiconductor module 420 differs from that in the second embodiment. A shape of a semiconductor package 421 in the semiconductor module 420 differs from that in the semiconductor module 20. The fourth embodiment is similar to the second embodiment except these things.

A step 421a is formed in a portion, which is provided between a metal plate 230 and a terminal extending from the semiconductor package 421, in the semiconductor package 421. In the present embodiment, steps 421a are respectively formed between a main terminal 22 and a first section 232 and between a signal terminal 23 and a second section 233 in the semiconductor package 421.

As a result, a creepage distance between the metal plate 230 and each of the main terminal 22 and the signal terminal 23 can be ensured. Therefore, a creepage discharge between the metal plate 230 and the main terminal 22 or the signal terminal 23 can be suppressed. In the present embodiment, the metal plate 230 need not be subjected to bending processing. Therefore, the creepage discharge can be suppressed at lower cost than in the third embodiment.

The step 421a may be formed in an entire peripheral portion of the semiconductor package 421. Alternatively, the step 421a may be formed only between the metal plate 230 and the terminal. A shape of the step 421a is not limited to that illustrated in FIG. 7. As the shape of the step 421a, all shapes that enable the creepage distance between the metal plate 230 and each of the main terminal 22 and the signal terminal 23 to extend can be adopted.

Fifth Embodiment

Figure 8:
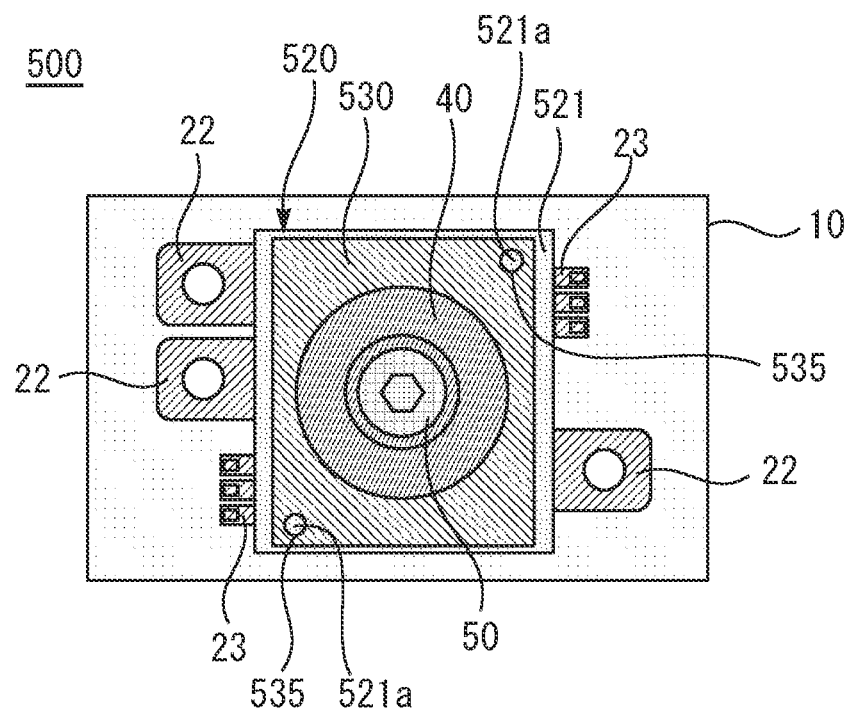
FIG. 8 is a plan view of a semiconductor device according to the fifth embodiment.

FIG. 8 is a plan view of a semiconductor device 500 according to the fifth embodiment. The semiconductor device 500 includes a semiconductor module 520. The semiconductor module 520 differs from that in the first embodiment in that a protrusion 521a is provided on an upper surface of a semiconductor package 521. Two protrusions 521a are provided at diagonal positions on the upper surface of the semiconductor package 521.

The semiconductor device 500 includes a metal plate 530. The metal plate 530 differs from that in the first embodiment in that openings 535 are formed. The openings 535 are respectively formed at positions corresponding to the protrusions 521a.

In the present embodiment, when the protrusions 521a are respectively fitted into the openings 535, the metal plate 530 can be positioned. Therefore, the semiconductor device 500 can be easily assembled.

A protrusion may be provided on a rear surface of the metal plate 530 and a recess may be provided on the upper surface of the semiconductor package 521 so that the metal plate 530 and the upper surface of the semiconductor package 521 may be fitted to each other. Respective positions, numbers, and shapes of protrusions 521a and openings 535 are not limited to those illustrated in FIG. 8. When the plurality of protrusions 521a are provided, positioning can be accurately performed.

Sixth Embodiment

Figure 9:
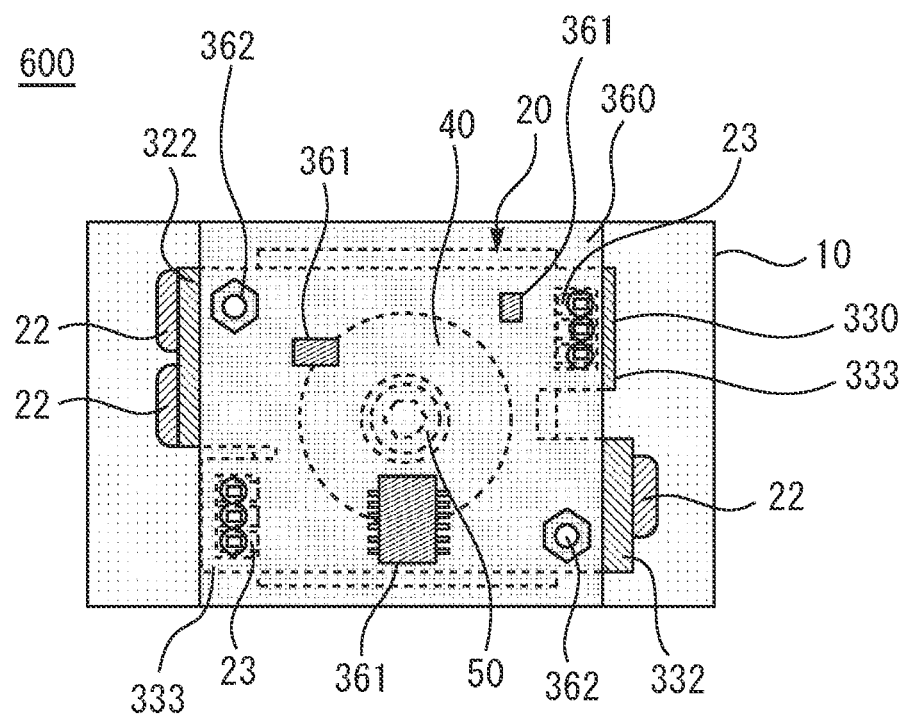
FIG. 9 is a plan view of a semiconductor device according to the sixth embodiment.
Figure 10:
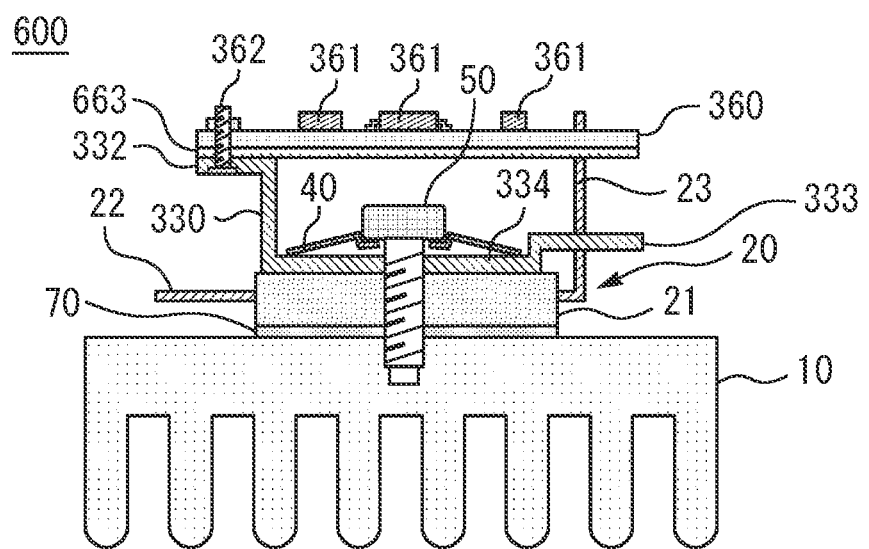
FIG. 10 is a cross-sectional view of the semiconductor device according to the sixth embodiment.

FIG. 9 is a plan view of a semiconductor device 600 according to the sixth embodiment. FIG. 10 is a cross-sectional view of the semiconductor device 600 according to the sixth embodiment. The semiconductor device 600 differs from that in the third embodiment in that a pattern 663 for grounding is provided on a surface on the opposite side to an upper surface of a control substrate 360. Other structures are similar to those in the third embodiment.

The pattern 663 for grounding is provided on a first section 332 as a support section, and is electrically connected to a metal plate 330. Accordingly, the pattern 663 for grounding is at the same potential as that of a frame ground via the metal plate 330. Therefore, electromagnetic noise generated by a semiconductor chip 26 or a main terminal 22 can be further shielded by the pattern 663 for grounding. Therefore, the control substrate 360 can be prevented from being affected by electromagnetic noise.

Seventh Embodiment

Figure 11:
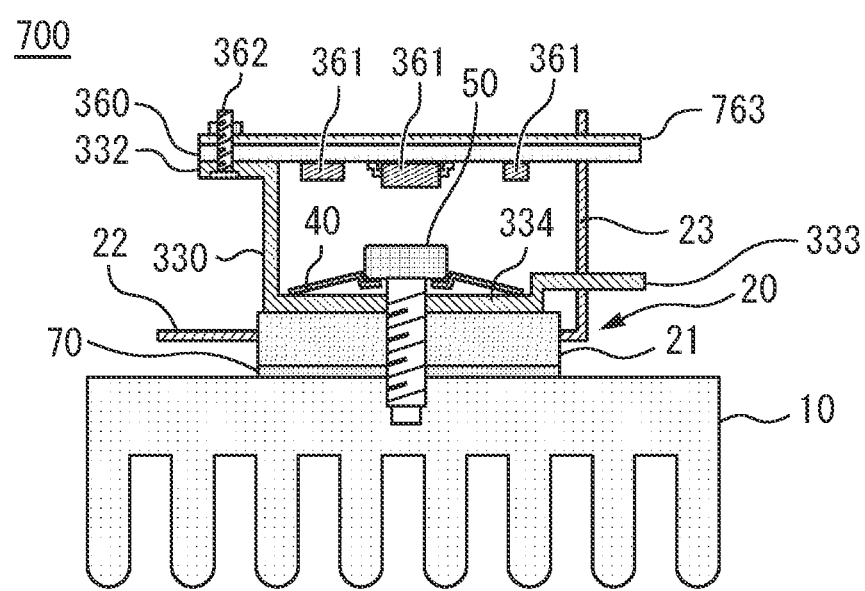
FIG. 11 is a cross-sectional view of a semiconductor device according to the seventh embodiment.

FIG. 11 is a cross-sectional view of a semiconductor device 700 according to the seventh embodiment. The semiconductor device 700 differs from that in the sixth embodiment in that a pattern 763 for grounding is provided on an upper surface of a control substrate 360. An electronic component 361 is mounted on a rear surface of the control substrate 360.

The control substrate 360 is fixed to a first section 332 in a metal plate 330 with a stud bolt 362. The stud bolt 362 penetrates the first section 332, the control substrate 360, and the pattern 763 for grounding. The pattern 763 for grounding is electrically connected to the metal plate 330 with the stud bolt 362. Accordingly, the pattern 763 for grounding is at the same potential as that of a frame ground via the metal plate 330. Therefore, electromagnetic noise from a peripheral device or a wiring can be shielded by the pattern 763 for grounding. Therefore, the control substrate 360 can be prevented from being affected by electromagnetic noise.

Note that the technical features described in the above embodiments may be combined as appropriate.

REFERENCE SIGNS LIST 10 cooler, 11 recess, 20 semiconductor module, 21 semiconductor package, 22 main terminal, 23 signal terminal, 24 through hole, 25 solder, 26 semiconductor chip, 30 metal plate, 31 through hole, 40 spring, 41 through hole, 50 fixture, 70 grease, 100, 200 semiconductor device, 230 metal plate, 232 first section, 233 second section, 234 main section, 300 semiconductor device, 330 metal plate, 332 first section, 333 second section, 334 main section, 360 control substrate, 361 electronic component, 362 stud bolt, 400 semiconductor device, 420 semiconductor module, 421 semiconductor package, 421a step, 500 semiconductor device, 520 semiconductor module, 521 semiconductor package, 521a protrusion, 530 metal plate, 535 opening, 600 semiconductor device, 663 pattern for grounding, 700 semiconductor device, 763 pattern for grounding

The invention claimed is:

1. A semiconductor device comprising:
   a cooler;
   a semiconductor package provided on an upper surface of the cooler;
   a metal plate having a main section provided on an upper surface of the semiconductor package;
   a spring that is provided above the main section and presses the main section toward the upper surface of the semiconductor package with an elastic force;
   a fixture that fixes the spring to an upper surface of the main section with the spring exerting the elastic force;
   a main terminal extending from the semiconductor package, an entirety of the main terminal extending straight outward from the semiconductor package; and
   a signal terminal extending from the semiconductor package and bent upward outside the semiconductor package, wherein
   a surface, which faces the upper surface of the semiconductor package, of the main section is flat,
   the metal plate and the upper surface of the semiconductor package are fitted to each other by a protrusion fitted into an opening, and
   the protrusion is provided in the metal plate and the opening is provided in the upper surface of the semiconductor package, or the opening is provided in the metal plate and the protrusion is provided in the upper surface of the semiconductor package.

2. The semiconductor device according to claim 1, wherein
   the fixture is a screw that penetrates the spring, the metal plate, and the semiconductor package to reach the cooler, and
   the metal plate and the cooler are electrically connected to each other with the screw.

3. The semiconductor device according to claim 1, wherein the spring is a belleville spring.

4. The semiconductor device according to claim 1, wherein grease is provided between the cooler and the semiconductor package.

5. The semiconductor device according to claim 1, wherein the semiconductor package is formed of resin.

6. The semiconductor device according to claim 1, wherein
the semiconductor package includes a semiconductor chip, and
the semiconductor chip is made with a wide bandgap semiconductor.

7. The semiconductor device according to claim 6, wherein the wide bandgap semiconductor is silicon carbide, a gallium nitride-based material, or diamond.

8. A semiconductor device comprising:
a cooler;
a semiconductor package provided on an upper surface of the cooler;
a metal plate having a main section provided on an upper surface of the semiconductor package;
a spring that is provided above the main section and presses the main section toward the upper surface of the semiconductor package with an elastic force;
a fixture that fixes the spring to an upper surface of the main section with the spring exerting the elastic force;
a main terminal extending from the semiconductor package, an entirety of the main terminal extending straight outward from the semiconductor package; and
a signal terminal extending from the semiconductor package and bent upward outside the semiconductor package, wherein
a surface, which faces the upper surface of the semiconductor package, of the main section is flat, and
the metal plate extends toward an outside of the semiconductor package in a planar view, and surrounds the signal terminal.

9. A semiconductor device comprising:
a cooler;
a semiconductor package provided on an upper surface of the cooler;
a metal plate having a main section provided on an upper surface of the semiconductor package;
a spring that is provided above the main section and presses the main section toward the upper surface of the semiconductor package with an elastic force;
a fixture that fixes the spring to an upper surface of the main section with the spring exerting the elastic force;
a main terminal extending from the semiconductor package, an entirety of the main terminal extending straight outward from the semiconductor package; and
a signal terminal extending from the semiconductor package and bent upward outside the semiconductor package, wherein
a surface, which faces the upper surface of the semiconductor package, of the main section is flat, and
the metal plate extends toward an outside of the semiconductor package and overlaps the main terminal, in a planar view.

10. A semiconductor device comprising:
a cooler;
a semiconductor package provided on an upper surface of the cooler;
a metal plate having a main section provided on an upper surface of the semiconductor package;
a spring that is provided above the main section and presses the main section toward the upper surface of the semiconductor package with an elastic force;
a fixture that fixes the spring to an upper surface of the main section with the spring exerting the elastic force;
a main terminal extending from the semiconductor package, an entirety of the main terminal extending straight outward from the semiconductor package; and
a signal terminal extending from the semiconductor package and bent upward outside the semiconductor package, wherein
a surface, which faces the upper surface of the semiconductor package, of the main section is flat, and
the metal plate is bent upward outside the main section.

11. A semiconductor device comprising:
a cooler;
a semiconductor package provided on an upper surface of the cooler;
a metal plate having a main section provided on an upper surface of the semiconductor package;
a spring that is provided above the main section and presses the main section toward the upper surface of the semiconductor package with an elastic force;
a fixture that fixes the spring to an upper surface of the main section with the spring exerting the elastic force;
a main terminal extending from the semiconductor package, an entirety of the main terminal extending straight outward from the semiconductor package; and
a signal terminal extending from the semiconductor package and bent upward outside the semiconductor package, wherein
a surface, which faces the upper surface of the semiconductor package, of the main section is flat, and
a step is formed in a portion of the semiconductor package, the step being provided between the metal plate and the main terminal.

12. A semiconductor device comprising:
a cooler;
a semiconductor package provided on an upper surface of the cooler;
a metal plate having a main section provided on an upper surface of the semiconductor package;
a spring that is provided above the main section and presses the main section toward the upper surface of the semiconductor package with an elastic force;
a fixture that fixes the spring to an upper surface of the main section with the spring exerting the elastic force;
a main terminal extending from the semiconductor package, an entirety of the main terminal extending straight outward from the semiconductor package;
a signal terminal extending from the semiconductor package and bent upward outside the semiconductor package; and
a control substrate provided above the metal plate, wherein
a surface, which faces the upper surface of the semiconductor package, of the main section is flat.

13. The semiconductor device according to claim 12, wherein the main terminal extending from the semiconductor package is separated from the control substrate by the metal plate.

14. A semiconductor device comprising:
a cooler;
a semiconductor package provided on an upper surface of the cooler;
a metal plate having a main section provided on an upper surface of the semiconductor package;
a spring that is provided above the main section and presses the main section toward the upper surface of the semiconductor package with an elastic force;
a fixture that fixes the spring to an upper surface of the main section with the spring exerting the elastic force; and a control substrate provided above the metal plate, wherein a surface, which faces the upper surface of the semiconductor package, of the main section is flat, the metal plate includes a support section extending upward from the main section, and the control substrate is supported by the support section.

15. The semiconductor device according to claim 14, wherein a pattern for grounding is provided on a surface, opposite to an upper surface, of the control substrate, and the pattern for grounding is provided on the support section, and is electrically connected to the metal plate.

16. The semiconductor device according to claim 14, wherein a pattern for grounding is provided on an upper surface of the control substrate, the control substrate is fixed to the support section with a bolt, and the pattern for grounding is electrically connected to the metal plate with the bolt.

17. A semiconductor device comprising:

a cooler;

a semiconductor package provided on an upper surface of the cooler;

a metal plate having a main section provided on an upper surface of the semiconductor package;

a spring that is provided above the main section and presses the main section toward the upper surface of the semiconductor package with an elastic force;

a fixture that fixes the spring to an upper surface of the main section with the spring exerting the elastic force; and a signal terminal extending from the semiconductor package, wherein a surface, which faces the upper surface of the semiconductor package, of the main section is flat, and the metal plate extends toward an outside of the semiconductor package in a planar view, and surrounds the signal terminal.

* * * * *